(12) United States Patent
Petersson et al.

(10) Patent No.: US 11,082,120 B2
(45) Date of Patent: Aug. 3, 2021

(54) DUAL-POLARIZATION BEAMFORMING

(71) Applicant: TELEFONAKTIEBOLAGET LM ERICSSON (PUBL), Stockholm (SE)

(72) Inventors: Sven Petersson, Sävedalen (SE);
Fredrik Athley, Kullavik (SE);
Andreas Nilsson, Gothenburg (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 0 days.

(21) Appl. No.: 16/593,146

(22) Filed: Oct. 4, 2019

(65) Prior Publication Data

US 2020/0036433 A1 Jan. 30, 2020

Related U.S. Application Data

(63) Continuation of application No. 15/329,980, filed as application No. PCT/EP2017/050514 on Jan. 12, 2017, now Pat. No. 10,461,836.

(51) Int. Cl.
| | |
|---|---|
| *H04B 7/10* | (2017.01) |
| *H04B 7/06* | (2006.01) |
| *H04B 7/0426* | (2017.01) |
| *H03F 3/72* | (2006.01) |
| *H01Q 3/26* | (2006.01) |

(Continued)

(52) U.S. Cl.
CPC .............. *H04B 7/10* (2013.01); *H01P 1/10* (2013.01); *H01Q 3/26* (2013.01); *H01Q 21/08* (2013.01); *H03F 3/602* (2013.01); *H03F 3/72* (2013.01); *H04B 7/043* (2013.01); *H04B 7/0617* (2013.01); *H04B 7/0691* (2013.01)

(58) Field of Classification Search
CPC ........ H04B 7/10; H04B 7/043; H04B 7/0617; H04B 7/0691; H01P 1/10; H01Q 3/26; H01Q 21/08; H03F 3/062; H03F 3/72
USPC ............................................ 342/373
See application file for complete search history.

(56) References Cited

U.S. PATENT DOCUMENTS 6,323,742 B1 11/2001 Ke
2014/0313093 A1* 10/2014 Smith .................. H01Q 21/26
343/795

(Continued)

FOREIGN PATENT DOCUMENTS

CN 102842756 B * 7/2015
JP 2005-318315 A 11/2005

(Continued)

OTHER PUBLICATIONS

Written Opinion of the International Preliminary Examining Authority, issued in corresponding International Application No. PCT/EP2017/050514, dated Dec. 4, 2018, 6 pages.

(Continued)

*Primary Examiner* — Harry K Liu
(74) *Attorney, Agent, or Firm* — Rothwell, Figg, Ernst & Manbeck, P.C.

(57) ABSTRACT

There is presented a wireless device for dual-polarization beamforming. The wireless device comprises an antenna array. The antenna array comprises antenna elements of mutually orthogonal polarizations and a baseband chain. The antenna elements of both polarizations are operatively connected to the baseband chain. There is also presented a method for dual-polarization beamforming as performed by such a wireless device.

15 Claims, 4 Drawing Sheets

(51) Int. Cl.
    *H01P 1/10*     (2006.01)
    *H03F 3/60*     (2006.01)
    *H01Q 21/08*    (2006.01)

(56)                References Cited

U.S. PATENT DOCUMENTS

2017/0264014 A1*   9/2017  Le-Ngoc ............... H01Q 21/06
2018/0084105 A1*   3/2018  Hiscock ............... H04B 7/0408
2018/0262363 A1    9/2018  Chamberlain et al.

FOREIGN PATENT DOCUMENTS

JP      2014531811 A      11/2014
JP      2015159481 A       9/2015
WO      2011050866 A1      5/2011
WO      2016141961 A1      9/2016
WO      2016142281 A1      9/2016

OTHER PUBLICATIONS

International Search Report and the Written Opinion of the International Searching Authority, issued in corresponding International Application No. PCT/EP2017/050514, dated Oct. 4, 2017, 14 pages.
Zhouyue PI et al. "A Millimeter-wave Massive MIMO System for Next Generation Mobile Broadband" Asilomar Conference on Signals, Systems and Computers, Conference Record, IEEE Computer Society, 2012, pp. 693-698.
Qualcomm Incorporated "Massive MIMO Architecture" 3GPP TSG-RAN WG1 #85, R1-164707, Nanjing, China, May 23-27, 2016, 9 pages.

* cited by examiner

DUAL-POLARIZATION BEAMFORMING

CROSS REFERENCE TO RELATED APPLICATION(S)

This application is a continuation of U.S. application Ser. No. 15/329,980, filed Jan. 27, 2017, which is a 35 U.S.C. § 371 National Phase Entry Application from PCT/EP2017/050514, filed Jan. 12, 2017, designating the United States, the disclosures of which are incorporated herein in their entirety by reference.

TECHNICAL FIELD

Embodiments presented herein relate to a method, a wireless device, a computer program, and a computer program product for dual-polarization beamforming.

BACKGROUND

In communications systems, there may be a challenge to obtain good performance and capacity for a given communications protocol, its parameters and the physical environment in which the communications system is deployed.

For example, for future generations of mobile communications systems frequency bands at many different carrier frequencies could be needed. For example, low such frequency bands could be needed to achieve sufficient network coverage for wireless devices and higher frequency bands (e.g. at millimeter wavelengths (mmW), i.e. near and above 30 GHz) could be needed to reach required network capacity. In general terms, at high frequencies the propagation properties of the radio channel are more challenging and beamforming both at the access node of the network and at the wireless devices might be required to reach a sufficient link budget.

The wireless devices could implement beamforming by means of analog beamforming, digital beamforming, or hybrid beamforming. Each implementation has its advantages and disadvantages. A digital beamforming implementation is the most flexible implementation of the three but also the costliest due to the large number of required radio chains and baseband chains. An analog beamforming implementation is the least flexible but cheaper to manufacture due to a reduced number of radio chains and baseband chains compared to the digital beamforming implementation. A hybrid beamforming implementation is a compromise between the analog and the digital beamforming implementations. As the skilled person understands, depending on cost and performance requirements of different wireless devices, different implementations will be needed.

Different antenna architectures for different frequency bands are being discussed for wireless devices. At high frequency bands (e.g. above 15 GHz) something called "panels" of antenna arrays are being discussed. These panels of antenna array may be uniform linear/rectangular arrays (ULAs/URAs), for example steered by using analog phase shifters. In order to get coverage from different directions, multiple panels of antenna array can be mounted on different sides of the wireless devices. Unless specifically stated, the terms antenna array and panels will hereinafter be used interchangeably.

For wireless devices the incoming signals can arrive from all different directions, hence it could be beneficial to have an antenna configuration at the wireless device which has the possibility to generate omnidirectional-like coverage in addition to high gain narrow directional beams. For example, if the wireless device rotates quickly it could be difficult to maintain narrow beam communication with the radio access network node serving the wireless devices, and hence a more robust omnidirectional coverage would temporarily be preferred at the wireless device.

Figure 1:
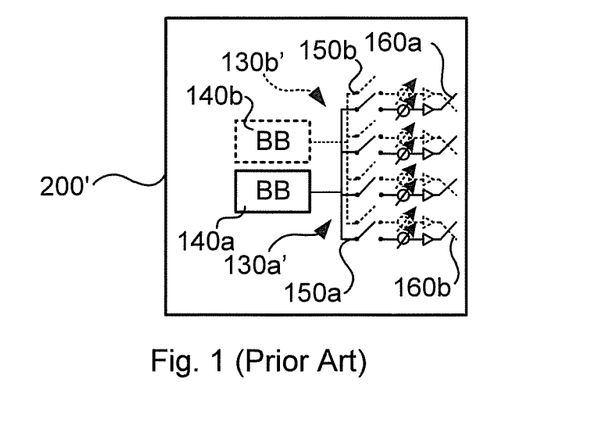
FIG. 1 schematically illustrates a wireless device according to state of the art.

FIG. 1 schematically illustrates a wireless device 200' comprising an example architecture of an analog antenna array 130a' that can be used to generate a large variety of beamwidths. The analog antenna array 130a' has four single polarized antenna elements 160a operatively connected to an analog distribution network 150a with one phase shifter and switch per antenna element. In turn the analog distribution network 150a is operatively connected to a single baseband (BB) chain 140a. A further antenna array 130b' with single polarized antenna elements 160a and being operatively connected to a further baseband chain 140b via its own analog distribution network 150b could be provided in order to enable communication using orthogonal polarization.

By switching off all antenna elements 160a but one, it is possible to generate a beam with a large beamwidth (same as the antenna element beamwidth). Also, by switching off different number of antenna elements 160a it is possible to create a large variety of different beamwidths. This architecture hence gives a high flexibility in shaping the beam of the analog antenna array 130a.

However, when switching off one or several antenna elements 160a of the analog antenna array 130a', part of the received and/or transmitted signal power will be lost during the combination/splitting of the signals. Designing low loss switch network allowing for one or more antennas to be disconnected may be possible but the design will be very complex, see for example document U.S. Pat. No. 6,323,742B1 for one such example. In addition to the complexity/loss issue applicable for both reception and transmission there is also a loss in available out power during transmission in case of distributed power amplifiers.

Hence, there is still a need for improved beamforming at a wireless device.

SUMMARY

An object of embodiments herein is to provide mechanisms for efficient beamforming at a wireless device.

According to a first aspect there is presented a wireless device for dual-polarization beamforming. The wireless device comprises an antenna array. The antenna array comprises antenna elements of mutually orthogonal polarizations and a baseband chain. The antenna elements of both polarizations are operatively connected to the baseband chain.

Advantageously such a wireless device can perform efficient beamforming.

Advantageously such a wireless device can create flexible beam shapes with an analog antenna array implementation without inserting extra losses in power.

According to a second aspect there is presented a wireless device for dual-polarization beamforming. The wireless device comprises an antenna array. The antenna array comprises antenna elements of mutually orthogonal polarizations and a baseband chain. The antenna elements of both polarizations are operatively connected to the baseband chain. The wireless device further comprises processing circuitry configured to cause the wireless device to communicate signals using the antenna array.

According to a third aspect there is presented a wireless device for dual-polarization beamforming. The wireless device comprises an antenna array. The antenna array comprises antenna elements of mutually orthogonal polarizations and a baseband chain. The antenna elements of both polarizations are operatively connected to the baseband chain. The wireless device further comprises a communication module configured to communicate signals using the antenna array.

According to a fourth aspect there is presented a method for dual-polarization beamforming. The method is performed by a wireless device. The wireless device comprises an antenna array. The antenna array comprises antenna elements of mutually orthogonal polarizations and a baseband chain. The antenna elements of both polarizations are operatively connected to the baseband chain. The method comprises communicating signals using the antenna array.

According to a fifth aspect there is presented a computer program for dual-polarization beamforming. The computer program comprises computer code which, when run on a wireless device comprises an antenna array, where the antenna array comprises antenna elements of mutually orthogonal polarizations and a baseband chain, and where the antenna elements of both polarizations are operatively connected to the baseband chain, causes the wireless device to communicate signals using the antenna array.

According to a sixth aspect there is presented a computer program product comprising a computer program according to the fifth aspect and a computer readable storage medium on which the computer program is stored. The computer readable storage medium could be a non-transitory computer readable storage medium.

It is to be noted that any feature of the first, second, third, fourth, fifth and sixth aspects may be applied to any other aspect, wherever appropriate. Likewise, any advantage of the first aspect may equally apply to the second, third, fourth, fifth and/or sixth aspect, respectively, and vice versa. Other objectives, features and advantages of the enclosed embodiments will be apparent from the following detailed disclosure, from the attached dependent claims as well as from the drawings.

Generally, all terms used in the claims are to be interpreted according to their ordinary meaning in the technical field, unless explicitly defined otherwise herein. All references to "a/an/the element, apparatus, component, means, step, etc." are to be interpreted openly as referring to at least one instance of the element, apparatus, component, means, step, etc., unless explicitly stated otherwise. The steps of any method disclosed herein do not have to be performed in the exact order disclosed, unless explicitly stated.

BRIEF DESCRIPTION OF THE DRAWINGS

The inventive concept is now described, by way of example, with reference to the accompanying drawings, in which.

DETAILED DESCRIPTION

The inventive concept will now be described more fully hereinafter with reference to the accompanying drawings, in which certain embodiments of the inventive concept are shown. This inventive concept may, however, be embodied in many different forms and should not be construed as limited to the embodiments set forth herein; rather, these embodiments are provided by way of example so that this disclosure will be thorough and complete, and will fully convey the scope of the inventive concept to those skilled in the art. Like numbers refer to like elements throughout the description. Any step or feature illustrated by dashed lines should be regarded as optional.

Figure 2:
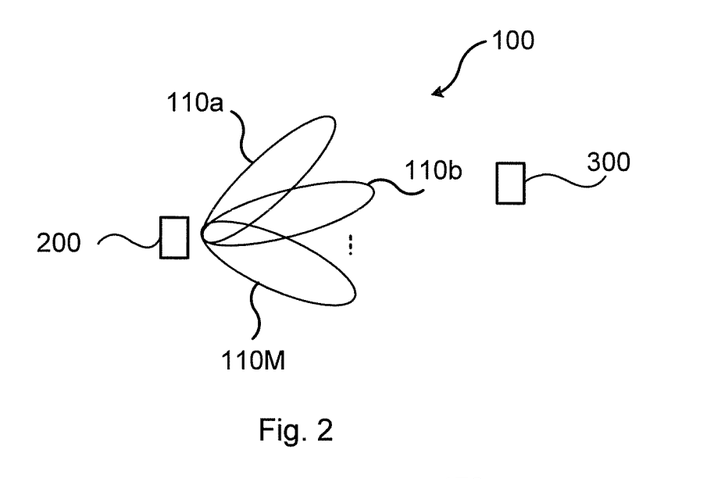
FIG. 2 is a schematic diagram illustrating a communications system according to embodiments.

FIG. 2 is a schematic diagram illustrating a communications system 100 comprising a radio access network node 300 providing network access to a wireless device 200. The wireless device 200 is assumed to comprise at least one receiver chain and is configured to receive signals from the radio access network node 300 in M beams 110$a$, 110$b$, ..., 110M. The beams 110$a$, 110$b$, ..., 110M might all have the same width, or at least two of the beams 110$a$, 110$b$, ..., 110M have mutually different widths. The wireless device 200 is thus configured to communicate in M beams 110$a$, 110$b$, ..., 110M (in contrast to omnidirectional beams).

The radio access network node 300 could be any of an access node, radio base station, base transceiver station, node B, evolved node B, g node B, access point, or the like. The wireless device 200 could be any of a wireless device, mobile station, mobile phone, handset, wireless local loop phone, user equipment (UE), smartphone, laptop computer, tablet computer, wireless sensor, or the like.

For antenna arrays with single polarized antenna elements connected through an analog distribution network it is difficult to generate beams with large beamwidths, which facilitates the generation of omnidirectional coverage at the wireless device 200.

The embodiments disclosed herein relate to mechanisms for dual-polarization beamforming. In order to obtain such mechanisms there is provided a wireless device 200, a method performed by the wireless device 200, a computer program product comprising code, for example in the form of a computer program, that when run on a wireless device 200, causes the wireless device 200 to perform the method.

There is proposed an antenna architecture that has a high flexibility in beam shaping, that does not lose power of the received/transmitted signals in the analog distribution network, and that does not suffer from poor, or reduced, power amplifier utilization.

Figure 3:
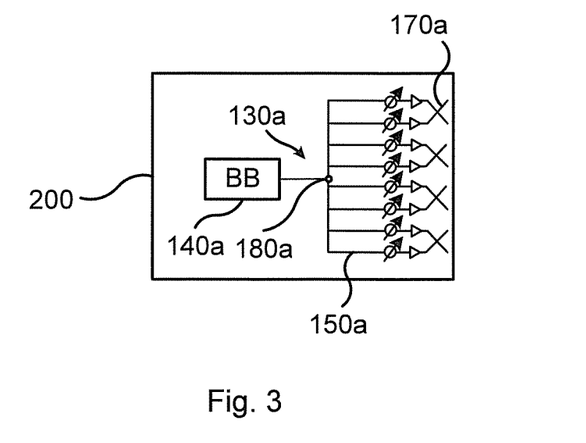
FIGS. 3, 4, and 5 schematically illustrate wireless devices according to embodiments.

FIG. 3 illustrates a wireless device 200 for dual-polarization beamforming according to an embodiment. The wireless device 200 is equipped with at least one antenna array 130$a$. The antenna array 130$a$ comprises antenna elements 170$a$ of mutually orthogonal polarizations. The antenna array 130$a$ further comprises its own baseband (BB) processing chain 140$a$. The antenna elements 170$a$ of both polarizations are operatively connected to the baseband chain 140$a$. In total there are M antenna elements 170$a$; M/2 in each polarization.

With antenna elements 170$a$ of mutually orthogonal polarizations is understood that pairs of the antenna elements 170$a$ have mutually orthogonal polarizations. Each such pair of antenna elements could define a dual-polarized antenna element. Alternatively, each such pair of antenna elements comprises two single-polarized antenna elements which together have mutually orthogonal polarizations.

All antenna elements 170a of mutually orthogonal polarizations of the antenna array 130a may thus be operatively connected to one single baseband chain 140 at a wireless device 200. Dual-polarization beamforming can thereby be used to increase the flexibility of the beam shaping without deteriorating the received/transmitted signal power.

The herein proposed antenna array architecture enables similar beam shaping flexibility as the prior art as illustrated in FIG. 2 but does not result in any losses in received/transmitted energy when generating wide beams.

By using an antenna array with antenna elements 170a of mutually orthogonal polarizations connected to one single baseband processing chain 140a, it is possible to generate a large variety of beam shapes for the baseband processing chain 140a. Applying principles disclosed in document WO2011/050866A1 it is, for example, possible to generate as wide array beamwidth as the element beamwidth regardless of how many antenna elements 170a there is in the antenna array 130a, thus resulting in dual-polarization beamforming.

Embodiments relating to further details of the wireless device 200 will now be disclosed.

When the wireless device 200 receives signals using the antenna array 130a, signals as combined from all the antenna elements 170a are to be fed to the baseband chain 140a. Therefore, according to an embodiment the antenna array 130a further comprises a signal combiner. The signal combiner is configured to combine signals received by the antenna elements 170a into a composite signal and to feed the composite signal to the baseband chain 140a.

When the wireless device 200 transmits signals using the antenna array 130a, one signal as generated by the baseband chain 140a is to be fed to all the antenna elements 170a. Hence, according to an embodiment the antenna array 130a further comprises a signal splitter. The signal splitter is configured to split a composite signal generated by the baseband chain 140a into split signals and to feed each one of the antenna elements 170a with one of the split signals.

The antenna array 130a may comprise a combined signal combiner/splitter. Hence, according to an embodiment the signal combiner and the signal splitter are provided in a single signal processing circuit 180a, 180b.

Further, regardless if there is only a single baseband chain 140a or at least two baseband chains 140a, 140b (see FIG. 4), each baseband chain 140a, 140b has only a single operative connection to its antenna elements 170a, 170b.

In the illustrative example of FIG. 3, each baseband processing chain 140a is operatively connected to its own analog beamformer 150a (defining an analog distribution network). Each analog beamformer 150a has its own set of analog precoder weights (e.g. defined by a codebook) by means of which the M different directional beams 110a, 110b, . . . , 110M can be formed. The phase and gain for each of the M antenna elements 170a could be individually controlled by a phase and/or gain control function. For example, according to the illustrative example of FIG. 3, each of the M antenna elements 170a could have its own phase shifter and amplitude taper, although it could be enough to just have phase shifters for M−1 or M−2 of the M antenna elements 160a.

Figure 4:
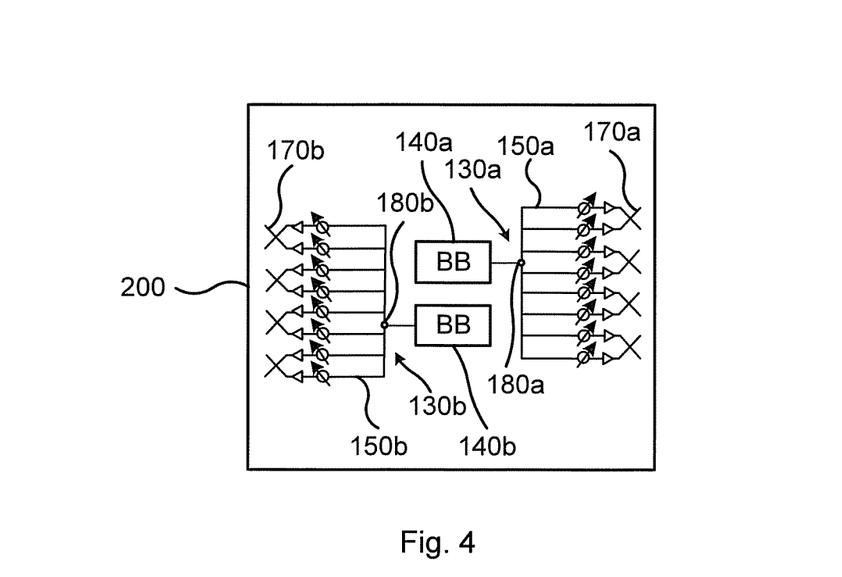

In the illustrative example of FIG. 3 the wireless device 200 is equipped with one antenna array with four antenna elements 170a of mutually orthogonal polarizations and an analog beamformer 150a. However, the herein disclosed embodiments are not limited in terms of number of antenna array. In general terms, the wireless device 200 comprises at least one antenna array 130a. FIG. 4 schematically illustrates an embodiment where the wireless device 200 comprises (at least) two antenna arrays 130a, 130b. Each of the two antenna arrays 130a, 130b comprises its own antenna elements 170a, 170b of mutually orthogonal polarizations and its own baseband chain 140a, 140b. The antenna elements 170a, 170b of both polarizations per antenna array 130a, 130b are operatively connected to a respective one of the baseband chains 140a, 140b.

The two antenna arrays 130a, 130b may be located on opposite sides of the wireless device 200 in order to improve the omnidirectional coverage.

Figure 5:
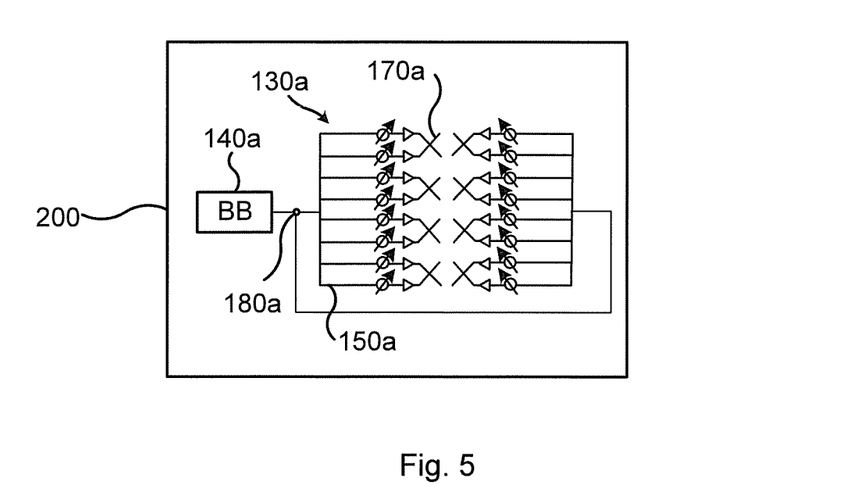

The antenna array 130a, 130b may be a one-dimensional antenna array 130a, 130b (as in FIG. 3 or 4) or a two-dimensional antenna array 130a, 130b. FIG. 5 schematically illustrates an embodiment where the antenna array 130a is a two-dimensional antenna array 130a. Regardless if the antenna array 130a, 130b is one-dimensional or two-dimensional, the antenna elements 170a, 170b at the wireless device 200 might be implemented in a regular or an irregular fashion. The physical structure of the wireless device 200 might affect the radiation patterns of the antenna elements 170a, 170b.

The herein disclosed antenna array 130a, 130b might not need any switches but instead phase shifters. Particularly, according to an embodiment the antenna array 130a, 130b further comprises at least M−2 phase shifters or even as many phase shifters as antenna elements 170a, 170b. Each phase shifter is operatively connected between the baseband chain 140a, 140b and one of the antenna elements 170a, 170b. By setting appropriate phase settings of the phase shifters it is possible to adapt the polarization of the antenna array 130a, 130b without changing the radiation pattern of the antenna array 130a, 130b. This can be used for polarization matching with the radio access network node 300 and hence improve link budget. One way for the wireless device 200 to perform polarization matching is for the wireless device 200 to evaluate different polarization settings, and then select the one that gave the best performance with respect to some metric, for example received power.

According to some aspects the herein disclosed antenna array 130a, 130b further comprises at least one power amplifier (PA) and at least one low noise amplifier (LNA). In general terms, when the antenna array 130a, 130b is configured for reception of signals it may comprise at least one LNA and when the antenna array 130a, 130b is configured for transmission of signals it may comprise at least one PA.

According to some aspects the at least one PA and the at least one LNAs are positioned close to the antenna elements (which gives one PA/LNA per antenna element). Hence, according to an embodiment each antenna array 130a, 130b further comprises as many PAs and LNAs as antenna elements 170a, 170b. Each PA and LNA is operatively connected between the baseband chain 140a, 140b and a respective one of the antenna elements 170a, 170b.

According to other aspects the at least one PA and the at least one LNAs are positioned close to the baseband unit (which gives one PA/LNA per baseband unit). Hence, according to an embodiment each antenna array 130a, 130b further comprises one single PA and one single LNA. The single PA and the single LNA are operatively connected between the baseband chain 140a, 140b and the signal combiner and/or the signal splitter.

Figure 6:
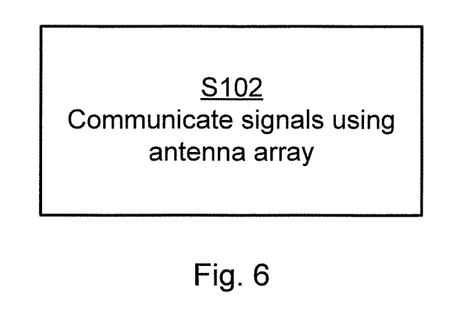
FIGS. 6 and 7 are flowcharts of methods according to embodiments.
Figure 7:
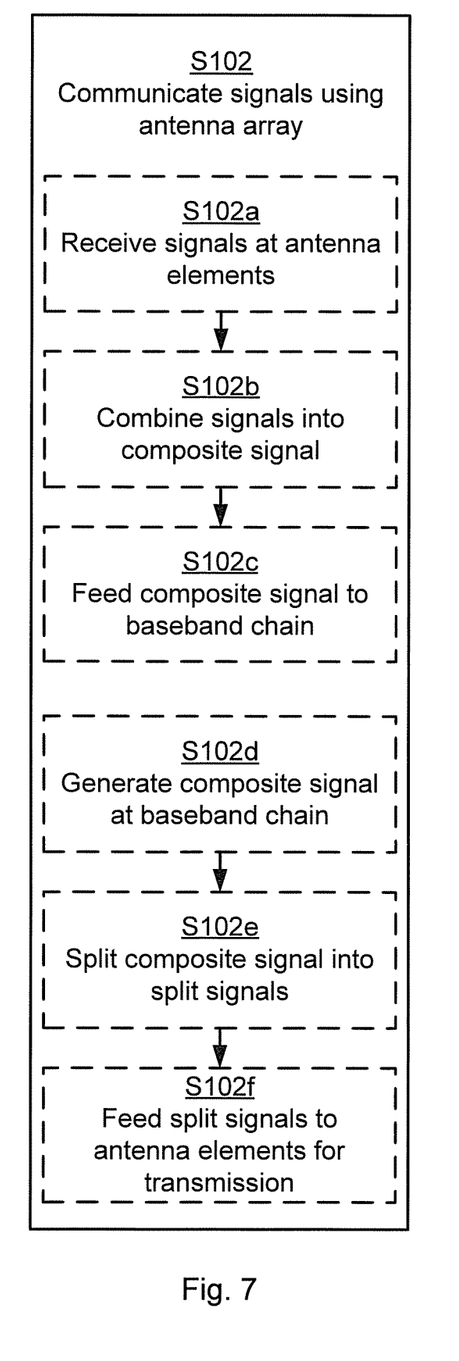

FIGS. 6 and 7 are flow charts illustrating embodiments of methods for dual-polarization beamforming. The methods are performed by the wireless device 200 as disclosed above. That is, the method is performed by a wireless device 200 that comprises an antenna array 130*a*, 130*b*, where the antenna array 130*a*, 130*b* comprises antenna elements 170*a*, 170*b* of mutually orthogonal polarizations and a baseband chain 140*a*, 140*b*, and where the antenna elements 170*a*, 170*b* of both polarizations are operatively connected to the baseband chain 140*a*, 140*b*. The method could thus be performed by a wireless device of any of FIG. 3, 4, or 5. The methods are advantageously provided as computer programs 1020.

Reference is now made to FIG. 6 illustrating a method for dual-polarization beamforming as performed by the wireless device 200 according to an embodiment.

S102: The wireless device 200 communicates signals using the antenna array 130*a*, 130*b*.

Embodiments relating to further details of dual-polarization beamforming as performed by the wireless device 200 will now be disclosed.

Reference is now made to FIG. 7 illustrating methods for dual-polarization beamforming as performed by the wireless device 200 according to further embodiments. It is assumed that step S102 is performed as described above with reference to FIG. 6 and a thus repeated description thereof is therefore omitted.

There may be different ways for the wireless device 200 to communicate signals in step S102. Different embodiments relating thereto will now be described in turn.

An embodiment relating to reception of signals (e.g. of signals transmitted from the radio access network node 300) at the wireless device 200 will now be disclosed.

During reception, the signals from all antenna elements 170*a*, 170*b* (of both polarizations) are combined together and then transferred to its baseband chain 140*a*, 140*b*. Hence, according to an embodiment the wireless device 200 is configured to perform steps S102*a*-S102*c* when communicating the signals:

S102*a*: The wireless device 200 receives signals at the antenna elements 170*a*, 170*b*.

S102*b*: The wireless device 200 combines the received signals into a composite signal.

S102*c*: The wireless device 200 feeds the composite signal to the baseband chain 140*a*, 140*b*.

An embodiment relating to transmission of signals (e.g. signals transmitted to the radio access network node 300) at the wireless device 200 will now be disclosed.

During transmission, the signal from each baseband chain 140*a*, 140*b* is split and then fed to all its antenna elements 170*a*, 170*b*. Hence, according to an embodiment the wireless device 200 is configured to perform steps S102*d*-S102*f* when communicating the signals:

S102*d*: The wireless device 200 generates a composite signal at the baseband chain 140*a*, 140*b*.

S102*e*: The wireless device 200 splits the composite signal into split signals.

S102*f*: The wireless device 200 feeds each one of the antenna elements 170*a*, 170*b* with one of the split signals for transmission of the split signals.

As the skilled person understands the wireless device 200 could be configured for both reception of signals and transmission of signals and hence be configured to perform steps S102*a*-S102*f*.

Figure 8:
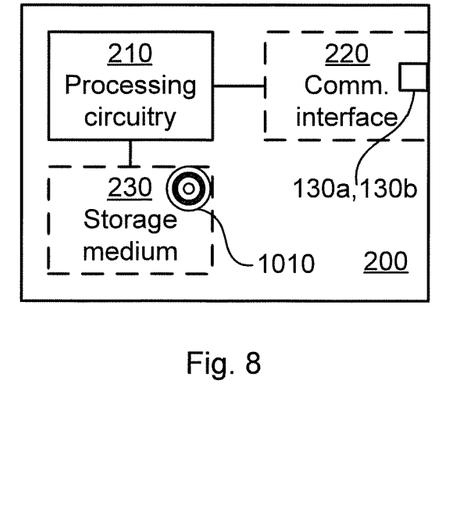
FIG. 8 is a schematic diagram showing functional units of a wireless device according to an embodiment.

FIG. 8 schematically illustrates, in terms of a number of functional units, the components of a wireless device 200 according to an embodiment. Processing circuitry 210 is provided using any combination of one or more of a suitable central processing unit (CPU), multiprocessor, microcontroller, digital signal processor (DSP), etc., capable of executing software instructions stored in a computer program product 1010 (as in FIG. 10), e.g. in the form of a storage medium 230. The processing circuitry 210 may further be provided as at least one application specific integrated circuit (ASIC), or field programmable gate array (FPGA).

Particularly, the processing circuitry 210 is configured to cause the wireless device 200 to perform a set of operations, or steps, S102, S102*a*-S102*f*, as disclosed above. For example, the storage medium 230 may store the set of operations, and the processing circuitry 210 may be configured to retrieve the set of operations from the storage medium 230 to cause the wireless device 200 to perform the set of operations. The set of operations may be provided as a set of executable instructions.

Thus the processing circuitry 210 is thereby arranged to execute methods as herein disclosed. The storage medium 230 may also comprise persistent storage, which, for example, can be any single one or combination of magnetic memory, optical memory, solid state memory or even remotely mounted memory. The wireless device 200 may further comprise a communications interface 220 at least configured for communications with a radio access network node 300. As such the communications interface 220 may comprise one or more transmitters and receivers, comprising analogue and digital components.

The wireless device 200 further comprises an antenna array 130*a*, 130*b* as herein disclosed. The antenna array 130*a*, 130*b* could be part of the communications interface 220.

The processing circuitry 210 controls the general operation of the wireless device 200 e.g. by sending data and control signals to the communications interface 220 and the storage medium 230, by receiving data and reports from the communications interface 220, and by retrieving data and instructions from the storage medium 230. Other components, as well as the related functionality, of the wireless device 200 are omitted in order not to obscure the concepts presented herein.

Figure 9:
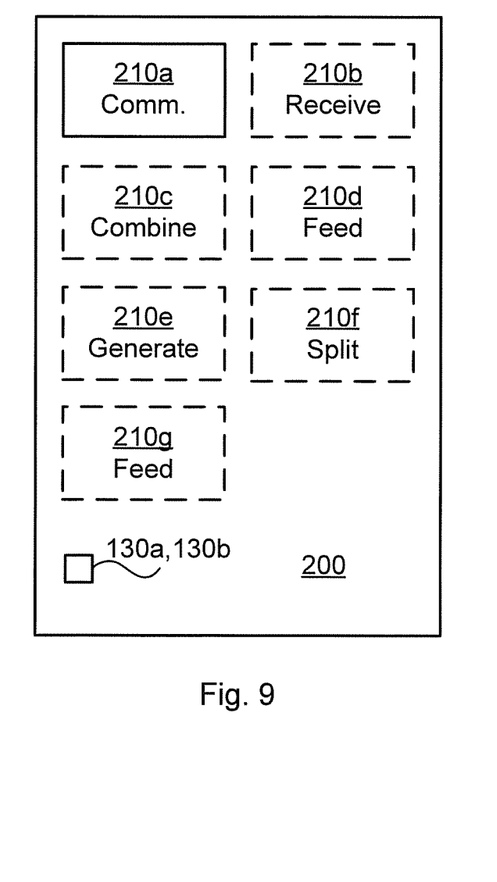
FIG. 9 is a schematic diagram showing functional modules of a wireless device according to an embodiment.

FIG. 9 schematically illustrates, in terms of a number of functional modules, the components of a wireless device 200 according to an embodiment. The wireless device 200 of FIG. 9 comprises a communication module 210*a* configured to perform step S102. The wireless device 200 of FIG. 9 may further comprise a number of optional functional modules, such as any of a receive module 210*b* configured to perform step S102*a*, a combine module 210C configured to perform step S102*b*, a feed module 210*d* configured to perform step S102*c*, a generate module 210*e* configured to perform step S102*d*, a split module 21 of configured to perform step S102*e*, and a feed module 210*g* configured to perform step S102*f*. The wireless device 200 further comprises an antenna array 130*a*, 130*b* as herein disclosed.

In general terms, each functional module 210*a*-210*g* may in one embodiment be implemented only in hardware and in another embodiment with the help of software, i.e., the latter embodiment having computer program instructions stored on the storage medium 230 which when run on the processing circuitry makes the wireless device 200 perform the corresponding steps mentioned above in conjunction with FIG. 9. It should also be mentioned that even though the modules correspond to parts of a computer program, they do not need to be separate modules therein, but the way in which they are implemented in software is dependent on the programming language used. Preferably, one or more or all functional modules 210a-210g may be implemented by the processing circuitry 210, possibly in cooperation with the communications interface 220 and/or the storage medium 230. The processing circuitry 210 may thus be configured to from the storage medium 230 fetch instructions as provided by a functional module 210a-210g and to execute these instructions, thereby performing any steps as disclosed herein.

The wireless device 200 may be provided as a standalone device or as a part of at least one further device. Thus, a first portion of the instructions performed by the wireless device 200 may be executed in a first device, and a second portion of the instructions performed by the wireless device 200 may be executed in a second device; the herein disclosed embodiments are not limited to any particular number of devices on which the instructions performed by the wireless device 200 may be executed. Hence, the methods according to the herein disclosed embodiments are suitable to be performed by a wireless device 200 residing in a cloud computational environment. Therefore, although a single processing circuitry 210 is illustrated in FIG. 8 the processing circuitry 210 may be distributed among a plurality of devices, or nodes. The same applies to the functional modules 210a-210g of FIG. 9 and the computer program 1020 of FIG. 10 (see below).

Figure 10:
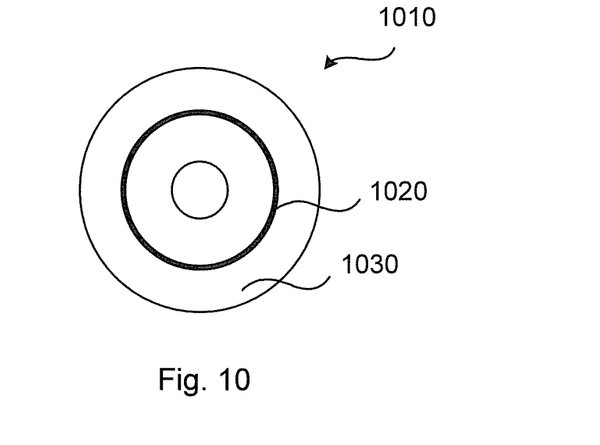
FIG. 10 shows one example of a computer program product comprising computer readable storage medium according to an embodiment.

FIG. 10 shows one example of a computer program product 1010 comprising computer readable storage medium 1030. On this computer readable storage medium 1030, a computer program 1020 can be stored, which computer program 1020 can cause the processing circuitry 210 and thereto operatively coupled entities and devices, such as the communications interface 220 and the storage medium 230, to execute methods according to embodiments described herein. The computer program 1020 and/or computer program product 1010 may thus provide means for performing any steps as herein disclosed.

In the example of FIG. 10, the computer program product 1010 is illustrated as an optical disc, such as a CD (compact disc) or a DVD (digital versatile disc) or a Blu-Ray disc. The computer program product 1010 could also be embodied as a memory, such as a random access memory (RAM), a read-only memory (ROM), an erasable programmable read-only memory (EPROM), or an electrically erasable programmable read-only memory (EEPROM) and more particularly as a non-volatile storage medium of a device in an external memory such as a USB (Universal Serial Bus) memory or a Flash memory, such as a compact Flash memory. Thus, while the computer program 1020 is here schematically shown as a track on the depicted optical disk, the computer program 1020 can be stored in any way which is suitable for the computer program product 1010.

The inventive concept has mainly been described above with reference to a few embodiments. However, as is readily appreciated by a person skilled in the art, other embodiments than the ones disclosed above are equally possible within the scope of the inventive concept, as defined by the appended patent claims.

The invention claimed is:

1. A wireless device for dual-polarization beamforming, the wireless device comprising:
   an antenna array, the antenna array comprising antenna elements of mutually orthogonal polarizations; and
   a baseband chain,
   wherein the antenna elements of both polarizations are operatively connected to the baseband chain, and
   wherein the antenna array further comprises a signal combiner configured to combine signals received by the antenna elements into a composite signal and to feed the composite signal to the baseband chain.

2. The wireless device according to claim 1, wherein the wireless device further comprises an analog beamformer, wherein the baseband chain is operatively connected to the analog beamformer.

3. The wireless device according to claim 1, wherein the wireless device comprises:
   at least two antenna arrays, each comprising its own antenna elements of mutually orthogonal polarizations; and
   at least two base band chains,
   and wherein the antenna elements of both polarizations per antenna array are operatively connected to a respective one of the baseband chains.

4. The wireless device according to claim 3, wherein a first of the at least two antenna arrays is located on a first side of the wireless device and a second of the at least two antenna arrays is located on a second side of the wireless device opposite the first side.

5. The wireless device according to claim 1, wherein the antenna array comprises at least one or more of a power amplifier (PA) and a low noise amplifier (LNA),
   and wherein the at least one or more PA and/or NA is positioned close to the antenna elements.

6. The wireless device according to claim 1, wherein all of the antenna elements share a single operative connection to the baseband chain.

7. The wireless device according to claim 1, wherein the antenna array further comprises a signal splitter configured to split a composite signal generated by the baseband chain into split signals and to feed each one of the antenna elements with one of the split signals.

8. The wireless device according to claim 7, wherein the signal combiner and the signal splitter are provided in a single signal processing circuit.

9. The wireless device according to claim 7, wherein the antenna array further comprises one single power amplifier and one single low noise amplifier, the single power amplifier and the single low noise amplifier being operatively connected between the baseband chain and the signal combiner and/or the signal splitter.

10. The wireless device according to claim 1, wherein the antenna array is a one-dimensional antenna array or a two-dimensional antenna array.

11. The wireless device according to claim 1, wherein there are M antenna elements in total, and wherein the antenna array further comprises at least M−2 phase shifters or as many phase shifters as antenna elements, each phase shifter being operatively connected between the baseband chain and one of the antenna elements.

12. The wireless device according to claim 1, wherein the antenna array further comprises as many power amplifiers and low noise amplifiers as antenna elements, each power amplifier and low noise amplifier being operatively connected between the baseband chain and a respective one of the antenna elements.

13. A method for dual-polarization beamforming, the method being performed by a wireless device, the wireless device comprising an antenna array, the antenna array comprising antenna elements of mutually orthogonal polarizations; and a baseband chain, the method comprising:
   receiving signals at the antenna elements;
   combining the received signals into a composite signal; and
   feeding the composite signal to the baseband chain.

14. A method for dual-polarization beamforming, the method being performed by a wireless device, the wireless device comprising an antenna array, the antenna array comprising antenna elements of mutually orthogonal polarizations; and a baseband chain, the method comprising:
- generating a composite signal at the baseband chain;
- splitting the composite signal into split signals; and
- feeding each one of the antenna elements with one of the split signals for transmission of the split signals.

15. A wireless device for dual-polarization beamforming, the wireless device comprising:
- an antenna array, the antenna array comprising antenna elements of mutually orthogonal polarizations; and
- a baseband chain,
- wherein the antenna elements of both polarizations are operatively connected to the baseband chain, and wherein all of the antenna elements share a single operative connection to the baseband chain.

* * * * *

UNITED STATES PATENT AND TRADEMARK OFFICE
CERTIFICATE OF CORRECTION

PATENT NO. : 11,082,120 B2
APPLICATION NO. : 16/593146
DATED : August 3, 2021
INVENTOR(S) : Petersson et al.

It is certified that error appears in the above-identified patent and that said Letters Patent is hereby corrected as shown below:

In the Specification

In Column 1, Line 7, delete "2017," and insert -- 2017, now Pat. No. 10,461,836, --, therefor.

In Column 8, Line 53, delete "21 of" and insert -- 210f --, therefor.

In the Claims

In Column 10, Line 25, in Claim 5, delete "NA" and insert -- LNA --, therefor.

Signed and Sealed this
Seventeenth Day of May, 2022

Katherine Kelly Vidal
*Director of the United States Patent and Trademark Office*